United States Patent
Mizoguchi (10) Patent No.: US 8,841,915 B2
(45) Date of Patent: Sep. 23, 2014

(54) BATTERY VOLTAGE MONITORING APPARATUS

(75) Inventor: Tomomichi Mizoguchi, Nagoya (JP)

(73) Assignee: Denso Corporation, Kariya (JP)

( * ) Notice: Subject to any disclaimer, the term of this patent is extended or adjusted under 35 U.S.C. 154(b) by 343 days.

(21) Appl. No.: 13/363,657

(22) Filed: Feb. 1, 2012

(65) Prior Publication Data

US 2012/0194199 A1 Aug. 2, 2012

(30) Foreign Application Priority Data

Feb. 1, 2011 (JP) ................... 2011-019735

(51) Int. Cl.
 *G01N 27/416* (2006.01)
 *G01R 31/36* (2006.01)
 *G01R 31/02* (2006.01)

(52) U.S. Cl.
 CPC .......... *G01R 31/3658* (2013.01); *G01R 31/026* (2013.01)
 USPC .......................................... 324/433; 324/426

(58) Field of Classification Search
 USPC .................................. 320/426, 433
 See application file for complete search history.

(56) References Cited

U.S. PATENT DOCUMENTS

| | | | |
|---|---|---|---|
| 6,255,826 B1 | 7/2001 | Ohsawa et al. | |
| 2009/0128157 A1* | 5/2009 | Moriya | 324/426 |

FOREIGN PATENT DOCUMENTS

| | | |
|---|---|---|
| JP | 2001-116776 | 4/2001 |
| JP | 2007-010580 | 1/2007 |
| JP | 2009-103546 | 5/2009 |

OTHER PUBLICATIONS

Machine translation of JP2009103546.*
Office Action (1 pg.) dated Feb. 5, 2013 issued in corresponding Japanese Application No. 2011-019735 with an at least partial English-language translation thereof (1 pg.).
U.S. Appl. No. 13/363,682, of Mizoguchi et al, filed Feb. 1 2012.

* cited by examiner

Primary Examiner — Samuel Berhanu
(74) Attorney, Agent, or Firm — Nixon & Vanderhye PC (57) ABSTRACT

The battery voltage monitoring apparatus has a structure in which, for each adjacent two of battery cells, the positive electrode of the battery cell on the higher voltage side and the negative electrode of the battery cell on the lower voltage side are connected to a corresponding one of common terminals provided in an RC filter circuit. The common terminal is branched into first and second branches respectively connected with a first resistor and a second resistor. The first and second resistors are connected to a corresponding one of positive side detection terminals and a corresponding one of negative side detection terminals, respectively. A capacitor is connected across a corresponding one of pairs of the positive side and negative side detection terminals. Switches for making short circuits respectively between the positive side detection terminals and between the negative side detection terminals corresponding to each adjacent two battery cells are provided.

4 Claims, 11 Drawing Sheets

IC'S INTERNAL EQUALIZATION

FIG. 3

IC'S EXTERNAL EQUALIZATION

|  | NORMAL STATE | L0 BROKEN | L1 BROKEN | L2 BROKEN | L3 BROKEN | L4 BROKEN | L5 BROKEN |
|---|---|---|---|---|---|---|---|
| V5' (ONLY SW5 IS ON) | $\frac{V5}{2}$ | $\frac{V5}{2}$ | $\frac{V5}{2}$ | $\frac{V5}{2}$ | $\frac{V5}{2}$ | 0 | 0 |
| V4' (ONLY SW4 IS ON) | $\frac{V4}{2}$ | $\frac{V4}{2}$ | $\frac{V4}{2}$ | $\frac{V4}{2}$ | 0 | 0 | $\frac{V4}{2}$ |
| V3' (ONLY SW3 IS ON) | $\frac{V3}{2}$ | $\frac{V3}{2}$ | $\frac{V3}{2}$ | 0 | 0 | $\frac{V3}{2}$ | $\frac{V3}{2}$ |
| V2' (ONLY SW2 IS ON) | $\frac{V2}{2}$ | $\frac{V2}{2}$ | 0 | 0 | $\frac{V2}{2}$ | $\frac{V2}{2}$ | $\frac{V2}{2}$ |
| V1' (ONLY SW1 IS ON) | $\frac{V1}{2}$ | 0 | 0 | $\frac{V1}{2}$ | $\frac{V1}{2}$ | $\frac{V1}{2}$ | $\frac{V1}{2}$ |

NORMAL STATE   $v_s = V_{cel} \times r/(2R)$

|     | ALL OFF | ONLY SW1 OFF | ONLY SW2 OFF | ONLY SW3 OFF | ONLY SW4 OFF | ONLY SW5 OFF |
|-----|---------|--------------|--------------|--------------|--------------|--------------|
| V5' | V5      | V5           | V5           | V5           | V5           | vs           |
| V4' | V4      | V4           | V4           | V4           | vs           | V4           |
| V3' | V3      | V3           | V3           | vs           | V3           | V3           |
| V2' | V2      | V2           | vs           | V2           | V2           | V2           |
| V1' | V1      | vs           | V1           | V1           | V1           | V1           |

FIG. 11B

WIRE BREAKAGE IN L2

|     | ALL OFF | ONLY SW1 OFF | ONLY SW2 OFF | ONLY SW3 OFF | ONLY SW4 OFF | ONLY SW5 OFF |
|-----|---------|--------------|--------------|--------------|--------------|--------------|
| V5' | V5      | V5           | V5           | V5           | V5           | vs           |
| V4' | V4      | V4           | V4           | V4           | vs           | V4           |
| V3' | (V3)    | (V3)         | V2+V3        | 0            | (V3)         | (V3)         |
| V2' | (V2)    | (V2)         | 0            | V2+V3        | (V2)         | (V2)         |
| V1' | V1      | vs           | V1           | V1           | V1           | V1           |

FIG. 11C

WIRE BREAKAGE IN L0

|     | ALL OFF | ONLY SW1 OFF | ONLY SW2 OFF | ONLY SW3 OFF | ONLY SW4 OFF | ONLY SW5 OFF |
|-----|---------|--------------|--------------|--------------|--------------|--------------|
| V5' | V5      | V5           | V5           | V5           | V5           | vs           |
| V4' | V4      | V4           | V4           | V4           | vs           | V4           |
| V3' | V3      | V3           | V3           | vs           | V3           | V3           |
| V2' | V2      | V2           | vs           | V2           | V2           | V2           |
| V1' | V1      | 0            | V1           | V1           | V1           | V1           |

BATTERY VOLTAGE MONITORING APPARATUS

This application claims priority to Japanese Patent Application No. 2011-19735 filed on Feb. 1, 2011, the entire contents of which are hereby incorporated by reference.

BACKGROUND OF THE INVENTION

1. Field of the Invention

The present disclosure relates to a battery voltage monitoring apparatus including an RC filter circuit.

2. Description of Related Art

There is known a battery voltage monitoring apparatus capable of detecting a cell voltage of each of battery cells constituting a battery pack, as described, for example, in Japanese Patent Application Laid-open No. 2007-10580. The battery voltage monitoring apparatus described in this patent document is connected with positive and negative terminals of each battery cell to detect the cell voltage of each battery cell.

Figure 6:
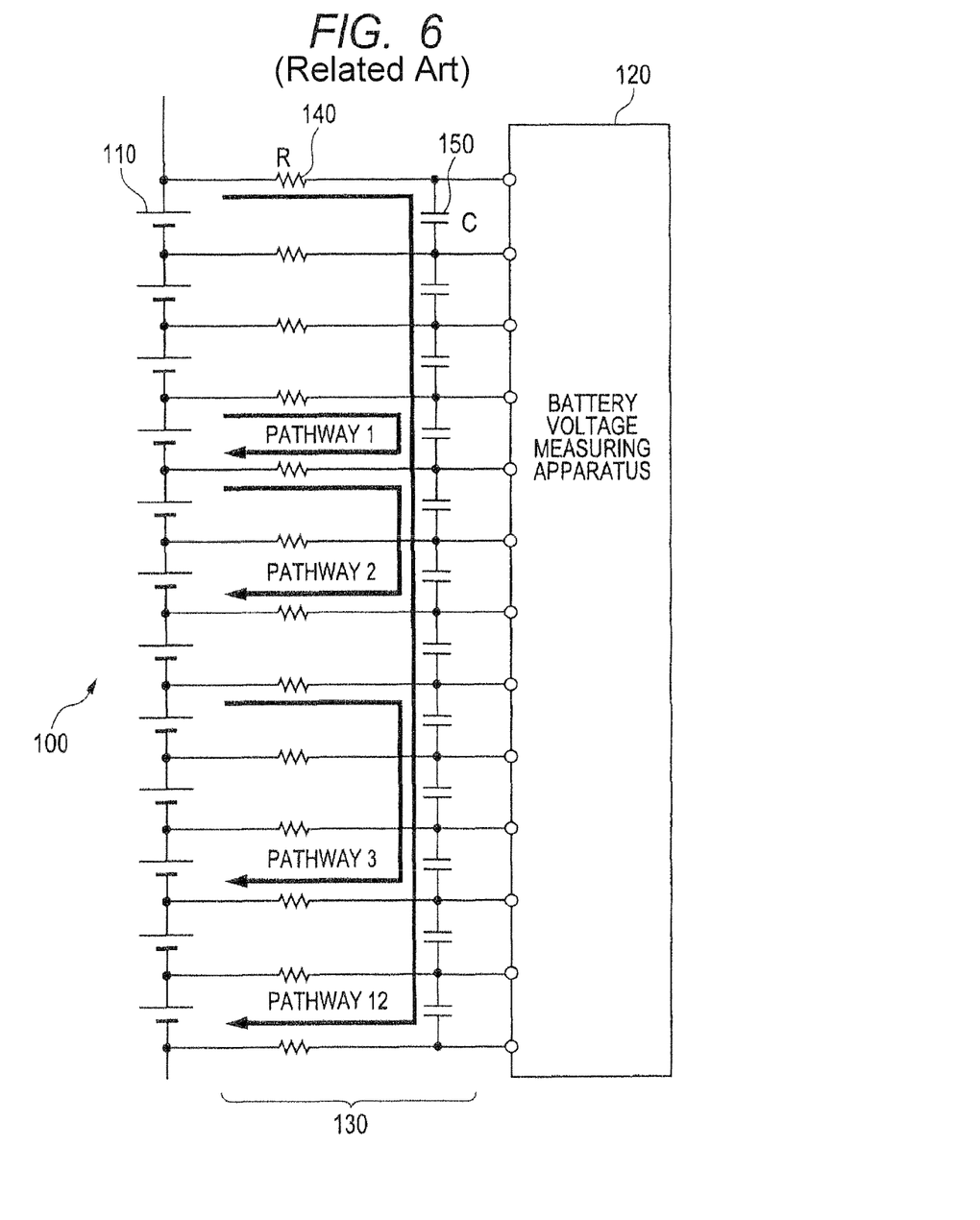
FIG. 6 is a diagram showing a conventional battery voltage monitoring apparatus including a filter circuit and a battery voltage measuring apparatus.

Generally, as shown in FIG. 6, such a battery voltage monitoring apparatus is provided with a filter circuit as a noise countermeasure. The battery voltage monitoring apparatus shown in FIG. 6 includes a filter circuit 130 and a battery voltage measuring apparatus 120. The filter circuit 130 is disposed between the positive and negative electrodes of respective battery cells 110 constituting a battery pack 100 and the battery voltage measuring apparatus 120.

A wire is connected between each of the positive and negative electrodes of each battery cell 110 and the battery voltage measuring apparatus 120 through the filter circuit 130. For each adjacent two of the battery cells 110, the wire connected to the negative electrode of one battery cell 110 is also used as the wire connected to the positive electrode of the other battery cell 110 except the battery cell 110 on the highest voltage side and the battery cell 110 on the lowest voltage side.

The filter circuit 130 includes resistors 140 respectively interposed in the wires connected between the electrodes of the respective battery cells 110 and input terminals of the battery voltage measuring apparatus 120, and capacitors 150 each connected across adjacent two of the input terminals. One of the resistors 140 and a corresponding one of the capacitors 150 constitute an RC filter as a low-pass filter for each one of the battery cells 110.

When a current pathway across n (n being a positive integer) neighboring battery cells 110 is referred to as "pathway n", since the pathway n is constituted of two resistors 140 and n series-connected capacitors 150, the transfer function Gain of the pathway n is given by the expression of $\text{Gain}=1/\{1+2\pi f \cdot (2R) \cdot (C/n)\}$, where R is a resistance of the resistor 140, C is a capacitance of the capacitor 150, and f is a cut-off frequency of the pathway n. In this expression, when $(2R) \cdot (C/n)=Tn$, since $Tn$ is proportional to $(1/n)$, and $fn=(1/Tn)$, the cut-off frequency fn is in proportion to n.

Figure 7:
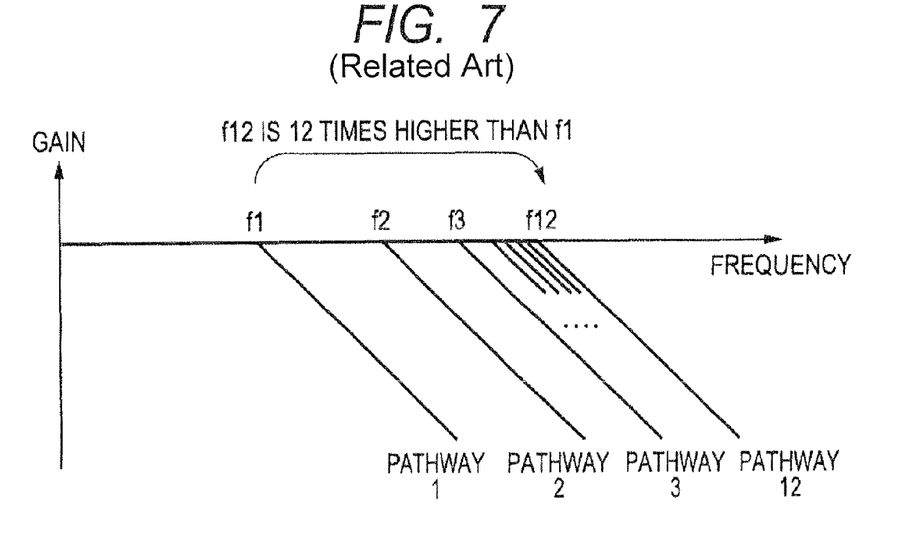
FIG. 7 is a diagram showing variation of the cut-off frequency of the filter circuit for different current pathways shown in FIG. 6.

FIG. 7 is a diagram showing variation of the cut-off frequency fn for various values of n. In FIG. 7, f1 indicates the cut-off frequency of pathway 1, f2 indicates the cut-off frequency of pathway 2, f3 indicates the cut-off frequency of pathway 3, and f12 indicates the cut-off frequency of pathway 12. As seen from FIG. 7, the cut-off frequency increases with the increase of n, that is, with the increase of the number of the battery cells 110 or the capacitors 150 connected in series. For example, when the battery pack 100 is constituted of twelve battery cells 110 as shown in FIG. 6, the maximum cut-off frequency is twelve times as high as the minimum cut-off frequency. Hence, the conventional battery voltage monitoring apparatus as described above has a problem in that the different pathways have different cut-off frequencies.

SUMMARY

An exemplary embodiment provides a battery voltage monitoring apparatus comprising:

pairs of positive side and negative side detection terminals provided respectively corresponding to positive and negative electrodes of battery cells connected in series to form a battery pack;

an RC filter circuit interposed between the positive and negative electrodes of the battery cells and the pairs of the positive side and negative side detection terminals; and a detection means for detecting a cell voltage of each of the battery cells applied across a corresponding one of the pairs of the positive side and negative side detection terminals, for each adjacent two of the battery cells, the positive electrode of the battery cell on the higher voltage side and the negative electrode of the battery cell on the lower voltage side being commonly connected to a common terminal provided in the RC filter circuit, the common terminal being branched into a first branch connected to one end of a first resistor as a component of the RC filter circuit and a second branch connected to one end of a second resistor as a component of the RC filter circuit, the first resistor being connected to a corresponding one of the positive side detection terminals at the other end thereof, the second resistor being connected to a corresponding one of the negative side detection terminals at the other end thereof, a capacitor being connected across a corresponding one of the pairs of the positive side and negative side detection terminals as a component of the RC filter circuit, wherein when one of two pairs of the positive side and negative side detection terminals for detecting the cell voltages of each adjacent two of the battery cells on the lower voltage side is referred to as a first pair, and the other of the two pairs is referred to as a second pair, the battery voltage monitoring apparatus further comprises:

a switch device for making a short circuit between the positive side detection terminals of the first and second pairs and between the negative side detection terminals of the first and second pairs; and a determination means for determining whether or not a circuit abnormality is present between the battery pack and the switch based on a voltage applied across the positive side and negative side detection terminals of at least one of the first and second pairs.

According to the exemplary embodiment, there is provided a battery voltage monitoring apparatus of the type including an RC filter circuit disposed between a battery pack constituted of battery cells connected in series and a battery voltage detecting circuit thereof, the battery voltage monitoring apparatus having a structure to reduce variation in cut-off frequency among respective current pathways through which discharge currents of the respective battery cell flow, and to prevent erroneous determination on presence or absence of a circuit abnormality between the battery pack and the RC filter circuit.

Other advantages and features of the invention will become apparent from the following description including the drawings and claims.

PREFERRED EMBODIMENTS OF THE INVENTION

Prior to describing a battery voltage monitoring apparatus according to an embodiment of the invention, a battery voltage monitoring apparatus devised by the inventors, which is comparable to the embodiment, is described with reference to FIG. 8 to FIGS. 11A-11C.

Figure 8:
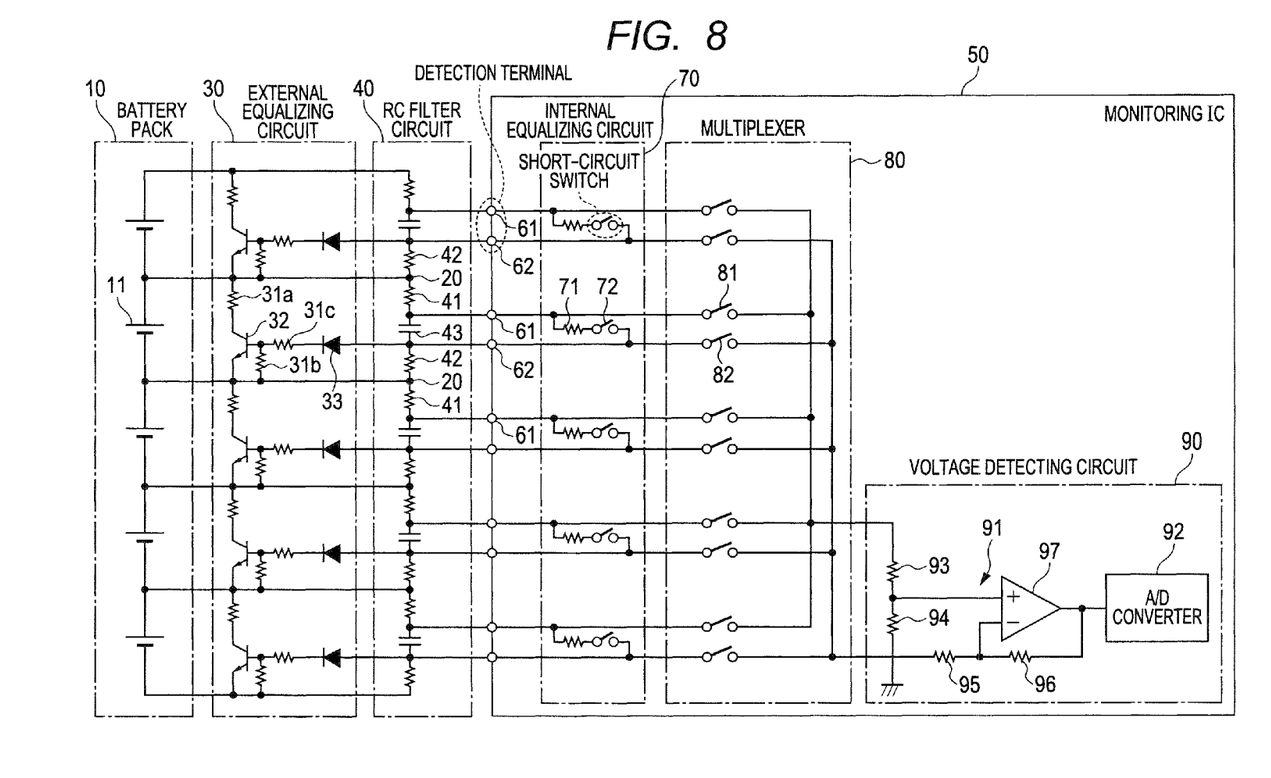
FIG. 8 is a diagram showing the overall structure of a battery voltage monitoring system including a battery voltage monitoring apparatus according to a comparative embodiment of the invention.

FIG. 8 is a diagram showing the overall structure of the battery voltage monitoring system including a battery pack 10 and the RC filter circuit devised by the inventors.

The battery pack 10 is constituted of a plurality of (five, for example) battery cells 11 connected in series. Rechargeable lithium-ion batteries are used as the battery cells 11. The battery pack 10 is mounted on a hybrid vehicle or an electric vehicle as a power source for electrical loads such as an inverter or a motor, or a power source for electronic devices.

For each adjacent two of the battery cells 11, the wire connected between the negative electrode of one battery cell 11 and one of common terminals 20 provided in a later-described RC filter circuit 40 is used also as the wire connected between the positive electrode of the other battery cell 11 and another one of the common terminals 20, except the battery cell 11 on the highest voltage side and the battery cell 11 on the lowest voltage side. That is, each common terminal 20 is connected to the electrode of adjacent two of the battery cells 11 by a single wire.

The battery voltage monitoring apparatus is an apparatus for monitoring the cell voltages of the respective battery cells 11 constituting the battery pack 10. The battery voltage monitoring apparatus is constituted of an external equalizing circuit 30, the RC filter circuit 40, a monitoring IC 50 and a microcomputer 55.

The external equalizing circuit 30 is a circuit for equalizing the cell voltages of the battery cells 11 by discharging the battery cells 11 to be discharged. The external equalizing circuit 30 includes, for each battery cell 11, resistors 31a and 31b, an NPN transistor 32 and a diode 33.

The resistor 31a is connected at one end thereof to the positive terminal of the battery cell 11 (or one of corresponding two of the common terminals 20 disposed in the RC filter circuit 40), and connected to the collector of the transistor 32 at the other end thereof. The emitter of the transistor 32 is connected to the negative terminal of the battery cell 11 (or the other of the corresponding two of the common terminals 20). The resistor 31b is connected between the base and emitter of the transistor 32. The resistor 31c and the diode 33 are connected in series between the base of the transistor 32 and a node between a later-described resistor 41 and a later-described capacitance 43 of the RC filter circuit 40. More specifically, the cathode of the diode 33 is connected to one end of the resistor 31c which is connected to the base of the transistor 32 at the other end thereof, and the anode of the diode 33 is connected to the above node. When a current is passed to the base of the transistor 32 through the diode 33 to turn on the transistor 32, a discharge current flows between the positive and negative electrodes of the battery cell 11 through the resistor 31a and the transistor 32.

The RC filter circuit 40 is a noise eliminating circuit disposed between the positive and negative terminals of the respective battery cells 11 and a plurality of paired detection terminals 61 and 62 provided in the monitoring IC. More specifically, the RC filter circuit 40 is a low-pass filter disposed between the external equalizing circuit 30 and the respective pairs of the detection terminals 61 and 62 of the monitoring IC 50. The pairs of the detection terminals 61 and 62 are provided for the pairs of the positive and negative electrodes of the battery cells 11 on a one-to-one basis.

The RC filter circuit 40 includes, for each battery cell 11, resistors 41 and 42 and a capacitor 43. The resistor 41 is connected to one of two branches of the common terminal 20 connected to the positive terminal of the corresponding battery cell 11. The resistor 42 is connected to one of two branches of the common terminal 20 connected to the negative terminal of the corresponding battery cell 11. The capacitor 43 is connected between the resistors 41 and 42. The capacitor 43 is connected also to the detection terminal 61 at one terminal thereof connected to the resistor 41, and to the detection terminal 62 at the other terminal thereof connected to the resistor 42.

In other words, the common terminal 20 connected to the corresponding battery cell 11 is branched into two to be connected with the resistor 41 and the resistor 42, respectively. These resistors 41 and 42 are connected to the paired detection terminals 61 and 62, respectively. The capacitor 43 is connected between the paired detection terminals 61 and 62.

In the RC filter circuit 40 having the above described structure, the resistors 41 and 42 are not interposed in the wire connected between the electrodes of the battery cell and the common terminal 20, but respectively connected to the branches of the common terminal 20. The anode of the diode 33 of the external equalizing circuit 30 is connected between the capacitor 43 and the resistor 42.

The common terminals 20 are shown as being provided in the RC filter circuit 40 in FIG. 8. However, they are actually disposed on the side closer to the battery pack 10 than the external equalizing circuit 30, because the battery voltage monitoring apparatus is implemented as a single electronic circuit board. It is a matter of course that when the common terminals 20 are disposed on the edge side of the electronic circuit board, each of the common terminals 20 is branched into two to be connected with the resistors 41 and 42, respectively.

The monitoring IC 50 is a device for detecting the cell voltage applied between the paired detection terminals 61 and 62 provided for each of the battery cells 11. The monitoring IC 50 includes the pairs of the detection terminals 61 and 62, an internal equalizing circuit 70, a multiplexer 80 and a voltage detecting circuit 90.

The internal equalizing circuit 70 is a circuit for equalizing the cell voltages of the respective battery cells 11 by passing a discharge current from each of the battery cells 11 to the inside of the monitoring IC 50. The internal equalizing circuit 70 includes, for each of the battery cells 11, a resistor 71 and a short-circuit switch 72 connected in series.

When the short-circuit switch 72 is turned on by the microcomputer 55, a discharge current from the battery cell 11 flows through the resistor 41, detection terminal 61, resistor 71, short-circuit switch 72, detection terminal 62 and resistor 42 in this order. At this time, since the anode of the diode 33 is connected to the path through which the discharge current flows, when the short-circuit switch 72 corresponding to the battery cell 11 is turned on and the internal equalizing circuit 70 operates, a current flows into the base of the transistor 32 through the diode 33 causing the transistor 32 to turn on. Accordingly, a current larger than the discharge current flowing inside the monitoring IC 50 flows through the battery cell 11 as a discharge current by way of the resistor 31a and the transistor 32.

The resistor 71 is connected to the detection terminal 61, while the resistor 72 is connected to the detection terminal 62. Accordingly, the short-circuit switch 72 is connected between the paired detection terminals 61 and 62.

The multiplexer 80 is a group of switches to enable connecting any one of the battery cells 11 constituting the battery pack 10 to the voltage detecting circuit 90. The multiplexer 80 includes, for each of the battery cells 11, a positive-electrode side switch 81 connected to the detection terminal 61 corresponding to the positive terminal of the battery cell 11 at one contact thereof, and a negative-electrode side switch 82 connected to the detection terminal 62 corresponding to the negative terminal of the battery cell 11 at one contact thereof.

Each of the switches 81 and 82 are constituted of a transistor. To detect the cell voltage of the battery cell 11, the positive-electrode side switch 81 and the negative-electrode side switch 82 corresponding to this battery cell 11 are turned on by a switch selecting circuit (not shown).

The voltage detecting circuit 90 is a circuit for amplifying the cell voltage of the battery cell 11 selected by the multiplexer 80 and measuring the amplified cell voltage. The voltage detecting circuit 90 includes a differential amplifier circuit 91 and an A/D converter 92.

The differential amplifier circuit 91, which is connected with the other ends of the switches 81 and 82 of the multiplexer 80, is constituted of resistors 93 to 96 and an operational amplifier 97. The resistor 93 is connected to the other ends of the positive-electrode side switches 81. The resistor 94 is connected between the resistor 94 and the ground. The connection node between the resistors 93 and 94 is connected to the non-inverting input terminal of the operational amplifier 97. The resistor 95 is connected to the other ends of the positive-electrode side switches 82 of the multiplexer 80. The resistor 96 is connected between the resistor 95 and the output terminal of the operational amplifier 97. The connection node between the resistors 95 and 96 is connected to the inverting input terminal of the operational amplifier 97. The output terminal of the operational amplifier 97 is connected to the input terminal of the A/D converter 92.

The A/D converter 92 is a circuit for measuring the cell voltage amplified by the differential amplifier circuit 91 in accordance with a command received from the microcomputer 55. The A/D converter 92 converts the measured cell voltage into a digital signal, and outputs it to the microcomputer 55.

The microcomputer 55, which includes a CPU, a ROM, an EEPROM and a RAM, executes programs stored in the ROM to monitor the states of the battery cells 11. The microcomputer 55 determines a remaining capacity or SOC (State of Charge) of the battery pack 10 based on the cell voltages of the battery cells 11 measured by the A/D converter 92 and the current flowing through the battery pack 10 measured by a not shown current measuring circuit. The microcomputer 55 performs control to cause the external and internal equalizing circuits 30 and 70 to operate for equalizing the cell voltages of the respective cell batteries 11 in accordance with the determined SOC.

The microcomputer 55 includes also a function of detecting, for each of the wires connected between the battery pack 10 and the battery voltage monitoring apparatus (that is, between the electrodes of the battery cells and the common terminals 20), a wire breakage based on the cell voltage measured when the corresponding short-circuit switch 72 of the internal equalizing circuit 70 is turned on. The value of the cell voltage detected when the short-circuit switch 72 is turned on is known in advance. Accordingly, the microcomputer 55 detects a wire breakage by comparing the value of the measured cell voltage with a value of a corresponding one of the cell voltages shown in a map prepared in advance.

Figure 9:
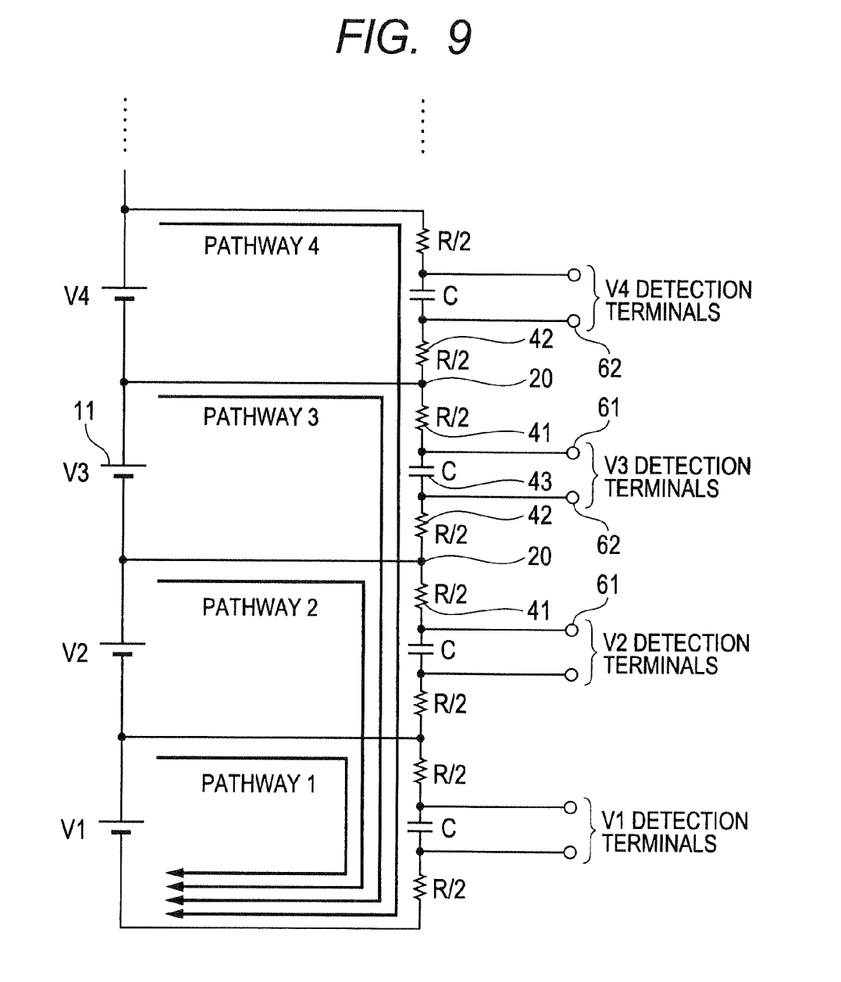
FIG. 9 is a diagram for explaining the filtering characteristic of an RC filter circuit included in the battery voltage monitoring apparatus shown in FIG. 8.

Next, the filtering characteristic of the RC filter circuit 40 of the battery voltage monitoring apparatus having the above described structure is explained with reference to FIG. 9. FIG. 9 shows four of the battery cells 11 and a part of the RC filter circuit 40 corresponding to these four battery cells 11. In FIG. 9, the external equalizing circuit 30 is omitted from illustration.

Here, the four battery cells 11 are indicated by the characters "V1", "V2", "V3" and "V4", respectively, in the order from the lowest voltage side to the highest voltage side. In the following, the paired detection terminals 61 and 62 corresponding to the battery cells V1, V2, V3 and V4, respectively, are referred to as "V1 detection terminals", "V2 detection terminals", "V3 detection terminals" and "V4 detection terminals", respectively. It is assumed that the resistance of each of the resistors 41 and 42 is R/2, and the capacitance of the capacitor 43 is C.

In the current pathway 1 across the electrodes of the battery cell V1, there are one resistor 41, one resistor 42 and one capacitor 43. Accordingly, the transfer function Gain of the current pathway 1 is given by the expression of Gain=$1/\{1+2\pi fRC\}$.

In the current pathway 2 across the electrodes of the battery cells V2 and V1, there are two resistors 41, two resistors 42 and two capacitors 43. Accordingly, the transfer function Gain of the current pathway 2 is given by the expression of Gain=$1/\{1+2\pi f\cdot(2R)\cdot(C/2)\}$.

In the current pathway 3 across the electrodes of the battery cells V3, V2 and V1, there are three resistors 41, three resistors 42 and three capacitors 43. Accordingly, the transfer function Gain of the current pathway 3 is given by the expression of Gain=1/{1+2 πf·(3R)·(C/3)}.

In the current pathway 4 across the electrodes of the battery cells V4, V3, V2 and V1, there are four resistors 41, four resistors 42 and four capacitors 43. Accordingly, the transfer function Gain of the current pathway 4 is given by the expression of Gain=1/{1+2 πf·(4R)·(C/4)}.

As explained above, since the resistors 41 and 42 are connected to the branches of each common terminal 20, the number of the resistors 41 and 42 increases with the increases of the number of the battery cells 11 included in the current pathway. Accordingly, variation of the cut-off frequency of the current pathway due to increase of the number of the capacitors 43 is cancelled out by the increase of the number of the resistors 41 and 42. Hence, according to this embodiment, since the cut-off frequency is the same for the respective pairs of the detection terminals 61 and 62, there is no variation in the cut-off frequency among the respective current pathways.

The cell voltages are detected in the following way. The pairs of the positive-electrode side switch 81 and the negative-electrode side switch 82 corresponding to the respective battery cells 11 are turned on sequentially in accordance with a changeover command outputted from the microcomputer 55. Here, it is assumed that the switches 81 and 82 corresponding to the battery cell on the lowest voltage side are turned on at first. In this case, the detection terminal 61 corresponding to the battery cell 11 on the lowest voltage side is applied with the voltage of the positive electrode of the battery cell 11 on the lowest voltage side, and the counter-part detection terminal 62 is applied with the voltage of the negative electrode of the battery cell 11 on the lowest voltage side.

In this state, when an A/D command to A/D-convert the cell voltage of the battery cell 11 on the lowest voltage side is outputted from the microcomputer 55 to the A/D converter 92, the A/D converter 92 A/D-converts the cell voltage received from the multiplexer 80 through the differential amplifier circuit 91, and outputs the A/D-converted cell voltage to the microcomputer 55. By repeating the above operation, the cell voltage is detected in the order from the battery cell 11 on the lowest voltage side to the battery cell 11 on the highest voltage side.

Next, the operation to detect a breakage in the wires connected between the battery pack 10 and the battery voltage monitoring apparatus performed by the battery voltage monitoring apparatus is explained with reference to FIGS. 10 and 11A to 11C. This wire breakage detection operation is performed in accordance with a program stored in the microcomputer 55.

Figure 10:
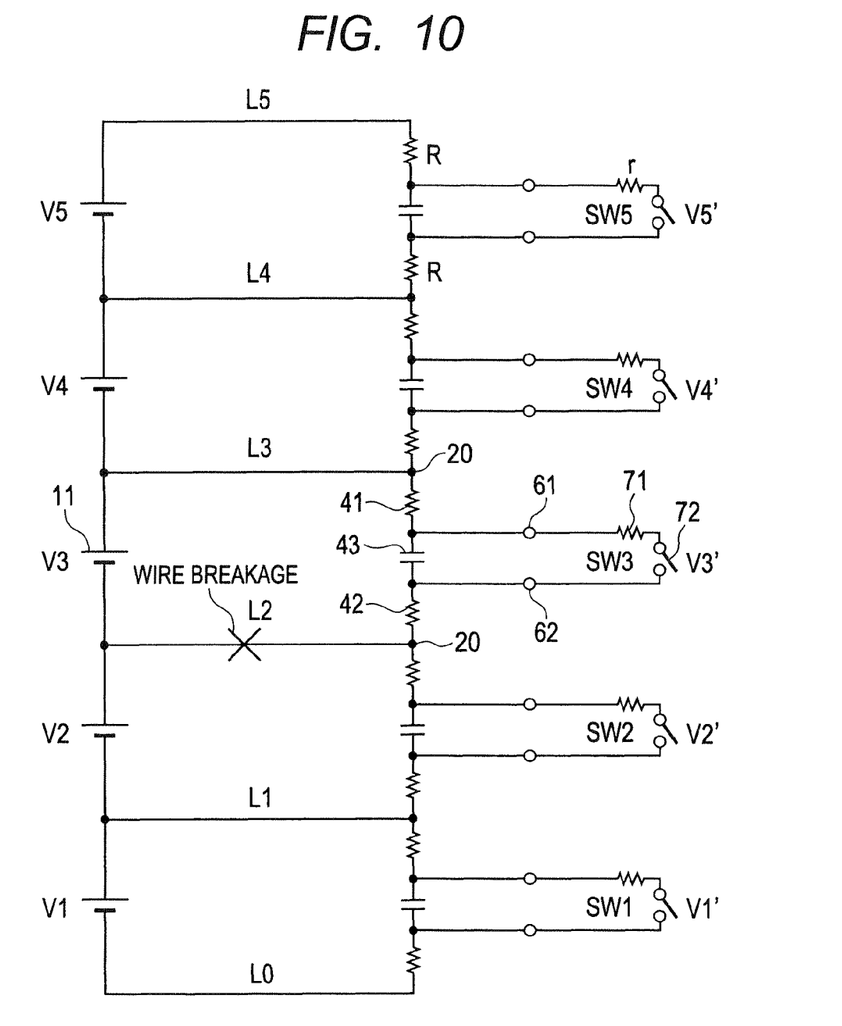
FIG. 10 is a diagram for explaining wire breakage detection performed in the battery voltage monitoring system shown in FIG. 8.

FIG. 10 shows the RC filter circuit 40 and the internal equalizing circuit 70 for explaining the principle of the wire breakage detection operation. In FIG. 10, the internal structures of the external equalizing circuit 30 and the monitoring IC 50 are omitted from illustration.

Here, the wire connected between the negative electrode of the battery cell V1 and the resistor 42 is indicated by the characters "L0", and the wires respectively connected between the positive electrodes and the corresponding resistors 42 are indicated by the characters, "L1", "L2", "L3", "L4" and "L5", respectively, in the order from the battery cells V1 to V5.

The short-circuit switches 72 corresponding to the battery cells V1 to V5, respectively, are indicated by the characters "SW1", "SW2", "SW3", "SW4" and "SW5", respectively. It is assumed that the resistance of the resistors 71 connected to the corresponding short-circuit switches 72 is r, and the voltages across the pairs of the detection terminals 61 and 62 corresponding to the battery cells V1 to V5 are indicated by the characters "V1'", "V2'", "V3'", "V4'" and "V5'", respectively. The cell voltages of the battery cells V1 to V5 are indicated by V1 to V5, respectively. Accordingly, the voltage V1' is equal to V1 in the normal state.

It is assumed that the resistances of the resistor 41 and the resistor 42 are R. The resistance r of the resistor 71 is set sufficiently smaller than the resistances of the resistor 41 and the resistor 42.

Figure 11A:
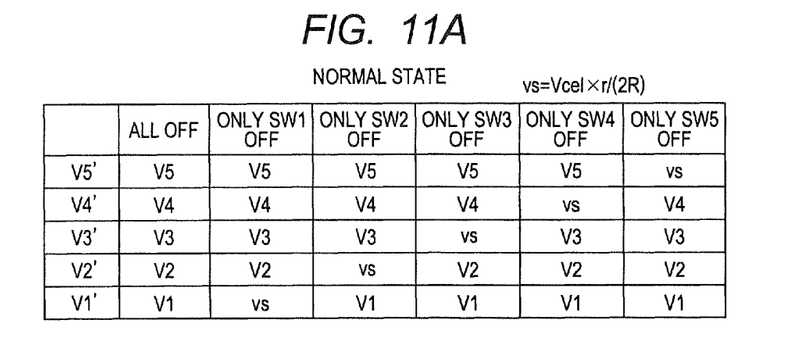
FIG. 11A is a table showing cell voltages when there is no wire breakage in the wires L1 to L5 shown in FIG. 10.
Figure 11B:
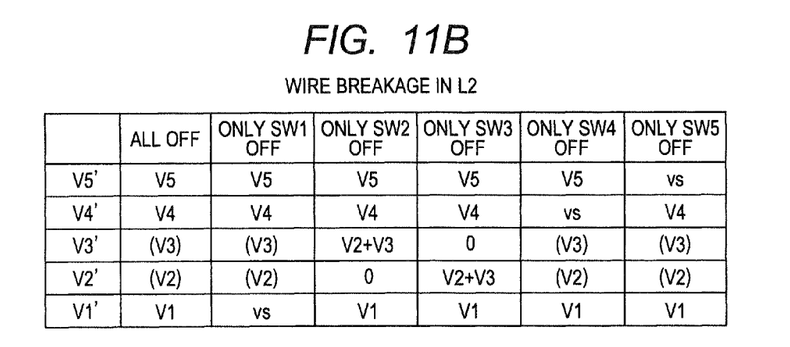
FIG. 11B is a table showing cell voltages when there is a wire breakage in the wire L2 shown in FIG. 10.
Figure 11C:
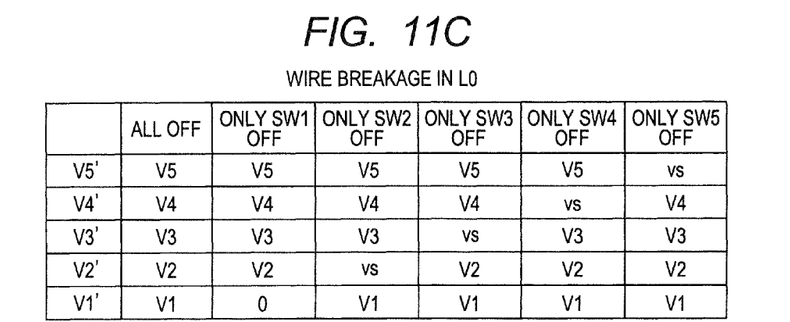
FIG. 11C is a table showing cell voltages when there is a wire breakage in the wire L0 shown in FIG. 10.

FIG. 11A is a table showing the cell voltages when there is no wire breakage. FIG. 11B is a table showing the cell voltages when there is a wire breakage in the wire L2 shown in FIG. 10. FIG. 11C is a table showing the cell voltages when there is a wire breakage in the wire L0 shown in FIG. 10.

When there is no wire breakage in the wires connected between the battery cells V1 to V5 and the RC filter circuit 40, the cell voltages of the battery cells V1 to V5 are as shown in the table of FIG. 11A.

To detect the cell voltage of one of the battery cells, the corresponding short circuit-switch 72 is turned on. For example, when only the switch SW1 corresponding to the battery cell V1 is turned on, the voltage V1' across the corresponding pair of the detection terminals 61 and 62 is detected to be "vs" equal to the voltage drop across the resistor 71. Here, when the cell voltage is Vcel, vs=Vcel×r/(2R+r).

Likewise, when only the switch SW2 corresponding to the battery cell V2 is turned on, the voltage V2' across the corresponding pair of the detection terminals 61 and 62 is detected to be vs. The above is the same for the other battery cells V3 to V5. As explained above, in the normal state where there is no wire breakage, the voltage across the detection terminals 61 and 62 is detected to be vs when any one of the short-circuit switch 72 is turned on.

Next, it is assumed that the wire L2 connected between the positive electrode of the battery cell V2 and the corresponding common terminal 20 is broken. In this case, since the cell voltage is not applied across the detection terminals 61 and 62 when only the switch SW2 corresponding to the battery cell V2 is turned on, the voltage V2' is detected to be zero as shown in the table of FIG. 11B. The microcomputer 55 detects that the detected voltage V2' is zero different from vs, and accordingly determines that the wire L2 is broken.

Further, when only the switch SW2 corresponding to the battery cell V2 is turned on, since the detection terminals 61 and 62 corresponding to the battery cell V3 are applied with V2 and V3, respectively, the voltage V3' is detected to be V2+V3 as shown in the table of FIG. 6B. Since the voltage V3' is detected to be V2+V3 as shown in the table of FIG. 11B although it should be V3 in the normal state as shown in the table of FIG. 11A, the microcomputer 55 determines that the wire L2 is broken.

Likewise, when only the switch SW3 corresponding to the battery cell V3 is turned on, the voltage V3' is detected to be zero, and the voltage V2' is detected to be V2+v3. The microcomputer 55 detects that the wire L2 is broken based on that the values of the detected voltages V2' and V3' are different from the values which they should take in the normal state.

Incidentally, when the wire L2 is broken, since the voltages V2' and V3' may not be detected correctly, they are put in parentheses such as (V2) or (V3) in the table of FIG. 11B.

If the wire L0 on the lowest voltage side is broken, the voltage V1' is detected to be 0 as shown in FIG. 11C when only the switch SW1 is turned on. Accordingly, the microcomputer 55 determines that the wire L0 is broken based on the detected voltage V1' being 0 and not vs. Although not shown in the drawings, if the wire L5 on the highest voltage side is broken, the voltage V5' corresponding to the battery cell V5 is detected to be zero when only the switch SW5 is turned on, and detected to be vs when one of the other switches SW1 to SW4 is turned on. The microcomputer 55 can determine presence of a wire breakage in the wire L5 based on that the voltage V5' is detected to be zero different from vs.

However, the above described way for detecting a wire breakage has a problem in that the wires L0 or L5 may be erroneously determined to be broken although not broken actually, or erroneously determined to be not broken although broken actually, because determination of presence of a wire breakage is made in accordance with the very small difference between vs and zero for the wires L0 and L5. Of course, for the wires other than the wires L0 and L5, the very small difference between vs and zero may become a cause of erroneous determination.

That is, although the above described battery voltage monitoring apparatus makes it possible to reduce variation in cut-off frequency among respective current pathways through which discharge currents of the respective battery cell flow, the above described battery voltage monitoring apparatus has a problem in that an erroneous determination on presence or absence of a circuit abnormality between the battery pack and the RC filter circuit may be made.

Next, a battery voltage monitoring apparatus according to an embodiment is described. This embodiment has a structure which makes it possible to reduce variation in cut-off frequency among respective current pathways through which discharge currents of the respective battery cell flow, and also to prevent an erroneous determination on presence or absence of a circuit abnormality between the battery pack and the RC filter circuit from being made.

In the following, the same parts as those shown in FIGS. 8 to 11 are indicated by the same reference letters or characters, and the explanations of these parts are omitted.

Figure 1:
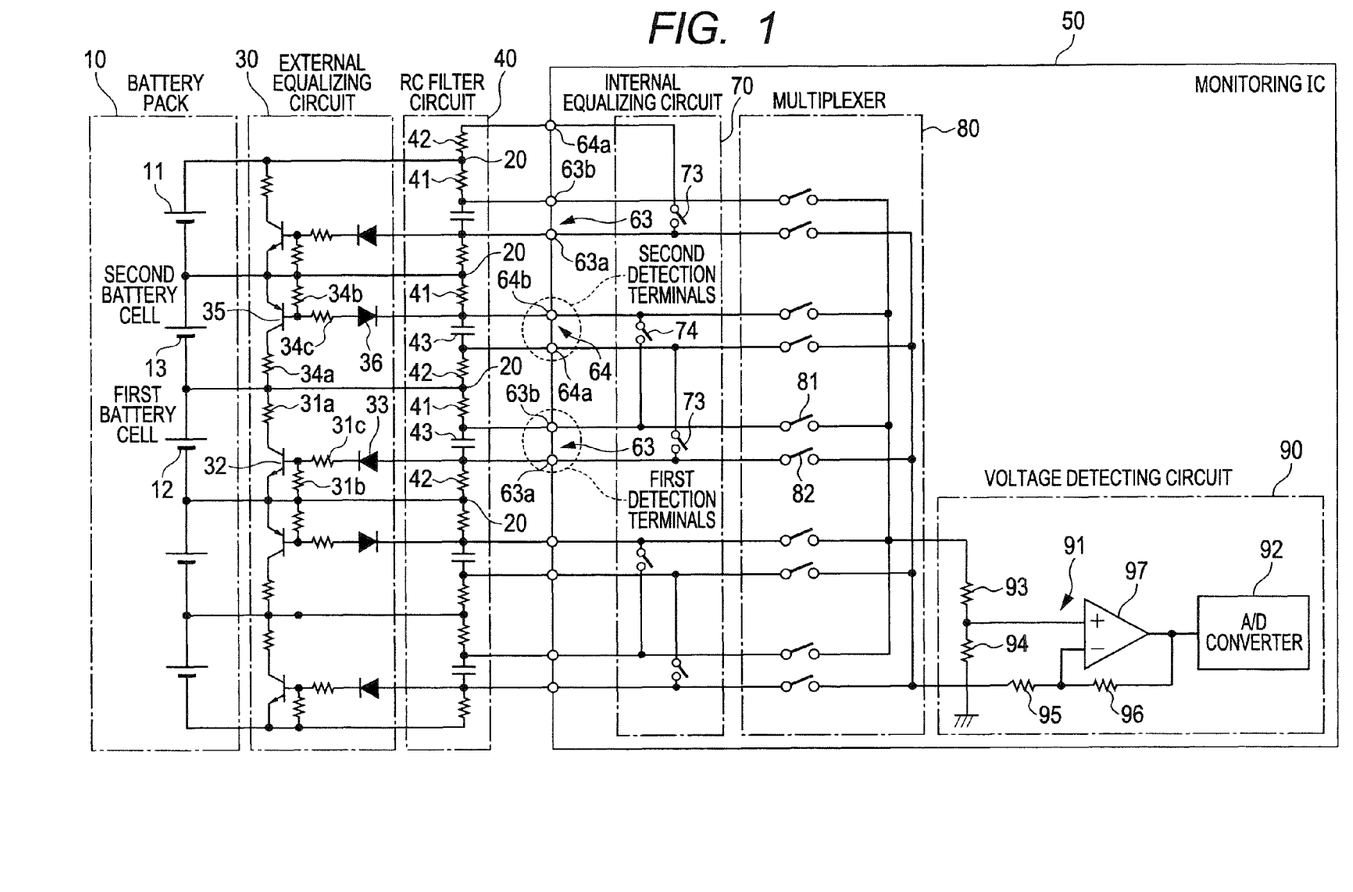
FIG. 1 is a diagram showing the overall structure of a battery voltage monitoring system including a battery voltage monitoring apparatus according to an embodiment of the invention.

FIG. 1 is a diagram showing the overall structure of the battery voltage monitoring system including a battery voltage monitoring apparatus according to an embodiment of the invention.

As shown in FIG. 1, the structure of the RC filter circuit 40, and the structures of the multiplexer 80 and the voltage detecting circuit 90 included in the monitoring IC 50 are the same as those of the voltage monitoring apparatus shown in FIG. 8.

In the following description, as shown in FIG. 1, of each adjacent two battery cells 11, the one on the lower voltage side is referred to as the first battery cell 12, and the one on the higher voltage side is referred to as the second battery cell 13. The paired detection terminals 61 and 62 for detecting the cell voltage of the first battery cell 12 are collectively referred to as the first detection terminals 63, and the paired detection terminals 61 and 62 for detecting the cell voltage of the second battery cell 13 are collectively referred to as the second detection terminals 64.

In this embodiment, the external equalizing circuit 30 includes, for each first battery cell 12, the resistors 31a, 31b and 31c, the NPN transistor 32 and the diode 33. Further, the external equalizing circuit 30 includes, for each second battery cell 13, resistors 34a, 34b and 34c, a PNP transistor 35 and a diode 36.

The resistor 34a is connected at one end thereof to the negative electrode of the second battery cell 13, and connected to the collector of the transistor 35 at the other end thereof. The emitter of the transistor 35 is connected to the positive electrode of the second battery cell 13. The resistor 34b is connected between the base and emitter of the transistor 35. The resistor 34c and the diode 36 are connected in series between the base of the transistor 35 and a corresponding one of the nodes provided in the RC filter circuit 40. More specifically, the anode of the diode 36 is connected to the resistor 34c, and the cathode of the diode 36 is connected to the connection node between the resistor 41 and the capacitor 43. In this embodiment, when a current is drawn from the base of the transistor 35 through the diode 36 to turn on the transistor 35, a discharge current from the second battery cell 13 flows through the transistor 35 and the resistor 34a.

The internal equalizing circuit 70 includes a first short-circuit switch 73 and a second short-circuit switch 74.

The first short-circuit switch 73 is a switch for short-circuiting the first battery cell 12 by connecting the lower-voltage side terminal 63a (corresponding to the detection terminal 62) of the first detection terminals 63 to the lower-voltage side terminal 64a (corresponding to the detection terminal 62) of the second detection terminals 64. The second short-circuit switch 73 is a switch for short-circuiting the second battery cell 12 by connecting the higher-voltage side terminal 63b (corresponding to the detection terminal 61) of the first detection terminals 63 to the higher-voltage side terminal 64b (corresponding to the detection terminal 61) of the second detection terminals 64.

Incidentally, as many as necessary of the pairs of the first and second battery cells 12 and 13 are connected in series. In this embodiment, since the number of the battery cells 11 constituting the battery pack 10 is five, the battery cell 11 on the highest voltage side is the first battery cell 12.

Accordingly, as shown in FIG. 1, the common terminal 20 electrically connected to the positive terminal of the first battery cell 11 on the highest voltage side branches into two branches connected with the resistor 41 and the resistor 42, respectively. The resistor 42 is connected to the corresponding lower-voltage side terminal 64a provided in the monitoring IC 50. The first short-circuit switch 73 is provided for making an electrical connection between this lower-voltage side terminal 64a and the lower-voltage side terminal 63a corresponding to the first battery cell 12 on the highest voltage side to short-circuit the first battery cell 12 on the highest voltage side.

Incidentally, the battery cell 11 on the lowest voltage side may be the second battery cell 13. In this case, the battery cell 11 on the highest side 11 is the second battery cell 13.

Next, the operation to equalize the cell voltages of the respective battery cells 11 performed by the battery voltage monitoring apparatus of this embodiment is explained with reference to FIGS. 2 and 3.

Figure 2:
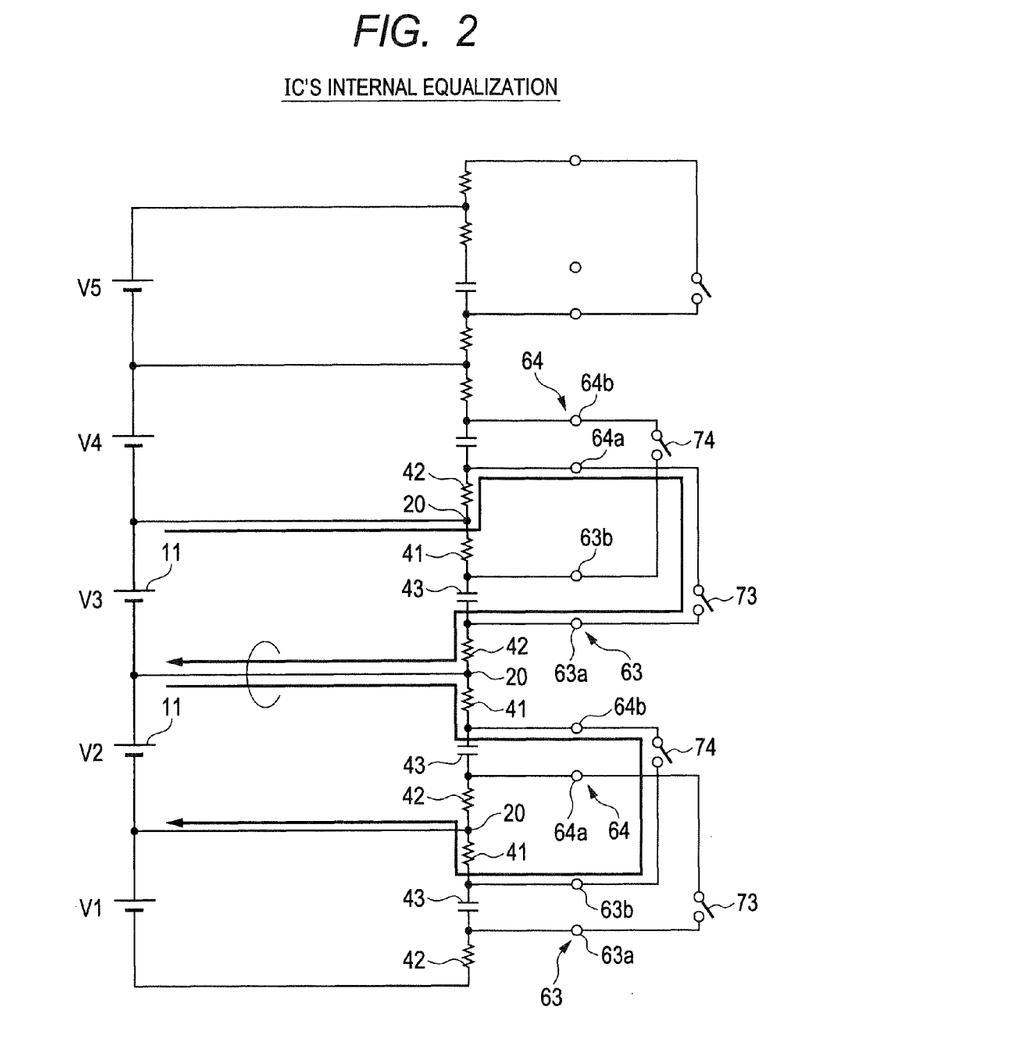
FIG. 2 is a diagram for explaining IC's internal equalization performed by an internal equalizing circuit included in the battery voltage monitoring apparatus shown in FIG. 1.

FIG. 2 is a diagram for explaining IC's internal equalization performed by the internal equalizing circuit 70 included in the battery voltage monitoring apparatus. In FIG. 2, the internal structures of the external equalizing circuit 30 and the monitoring IC 50 are omitted from illustration. Here, it is assumed that the first short-circuit switch 73 connected to the lower-voltage side terminal 63a corresponding to the battery cell V3 (the first battery cell 12) is turned on. In this case, a discharge current from the battery cell V3 flows through the current path including the resistor 42 corresponding to the battery cell V4, the lower-voltage side terminal 64a corresponding to the battery cell V4, the first short-circuit switch 73, the lower-voltage side terminal 63a corresponding to the battery cell V3 and the resistor 42 corresponding to the battery cell V3. As a result, the cell voltage of the cell battery V3 is equalized to those of the other battery cells.

Further, if the second short-circuit switch 74 connected to the higher-voltage side terminal 64b corresponding to the battery cell V2 (the second battery cell 13) is turned on together with the first short-circuit switch 73 corresponding to the battery cell V3, a discharge current from the battery cell V2 flows through the current path including the resistor 41 corresponding to the battery cell V2, the higher-voltage side terminal 64b corresponding to the battery cell V2, the second short-circuit switch 74, the higher-voltage side terminal 63b corresponding to the battery cell V1 and the resistor 42 corresponding to the battery cell V1.

At this time, since the wire connected between the common terminal 20 and the battery cells V2 and V3 has no resistor interposed, the discharge currents from the adjacent battery cells V2 and V3 can be prevented from being varied by a resistor effect.

Figure 3:
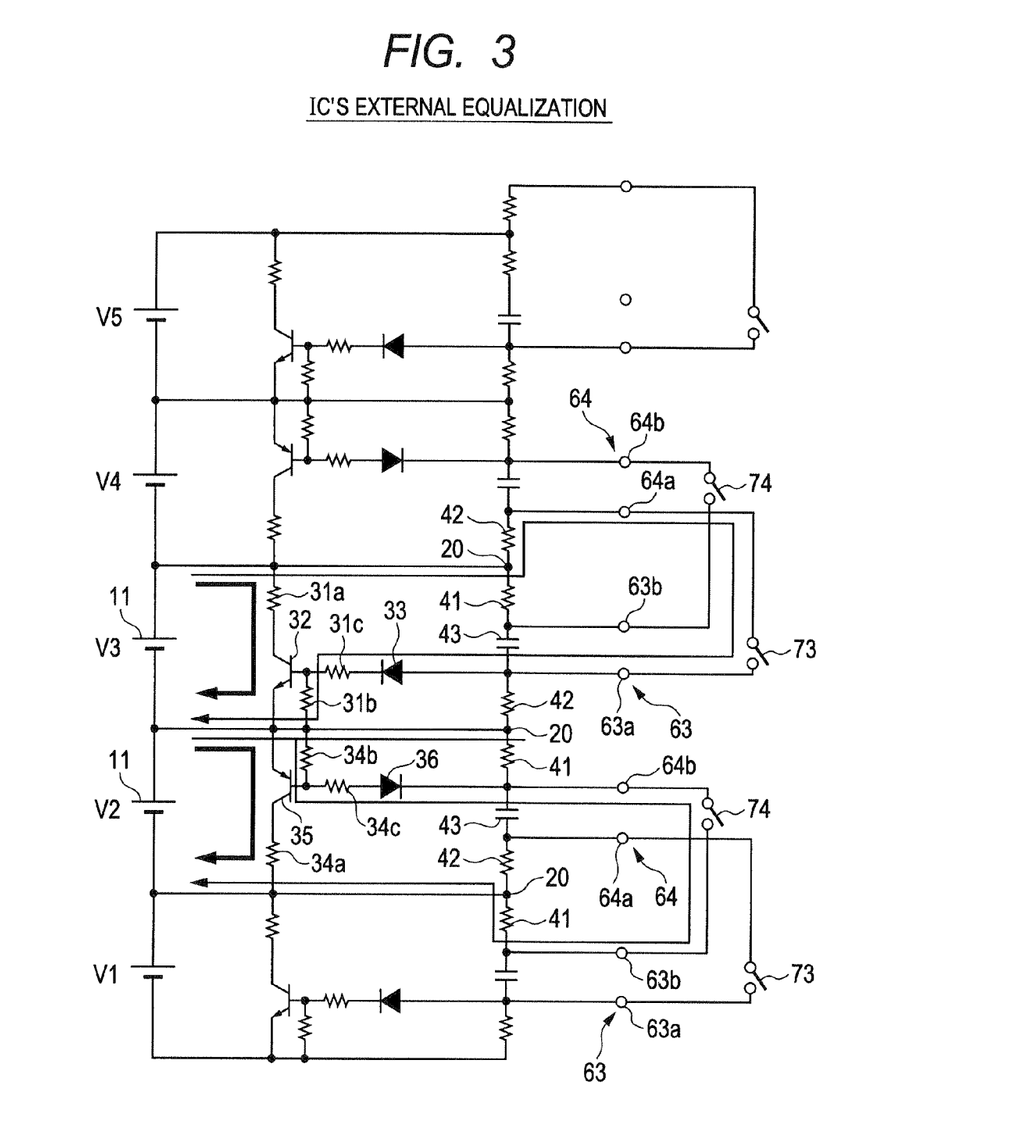
FIG. 3 is a diagram for explaining IC's external equalization performed by an external equalizing circuit included in the battery voltage monitoring apparatus shown in FIG. 1.

FIG. 3 is a diagram for explaining IC's external equalization performed by the external equalizing circuit 30 included in the battery voltage monitoring apparatus. In FIG. 3, the internal structure of the monitoring IC 50 is omitted from illustration. As explained in the foregoing, the external equalizing circuit 30 enables passing a large discharge current which the internal equalizing circuit 70 cannot pass, and the internal equalizing circuit 70 operates to equalize the cell voltages of the battery cells V2 and V3.

When a discharge current flows from the battery cell V2 to the higher-voltage side terminal 64b corresponding to this battery cell V2, a current flows to the diode 36 electrically connected to this higher-voltage side terminal 64b, as a result of which the base voltage of the transistor 35 is lowered causing the transistor 35 to turn on. That is, the external equalizing circuit 30 starts to operate in response to a voltage change of the higher-side terminal 64b of the second detection terminals 64. Hence, it is possible to cause a current larger than the discharge current flowing inside the monitoring IC 50 to flow through battery cell V2 as a discharge current byway of the transistor 35 and the resistor 34a Also, when a discharge current flows from the battery cell V3 to the higher-voltage side terminal 64b corresponding to this battery cell V3, a current flows to the diode 33, as a result of which the transistor 32 is turned on as with the case of the first embodiment. Hence, it is possible to cause a current larger than the discharge current flowing inside the monitoring IC to flow through the battery cell V3 by way of the resistor 31a and the transistor 32.

Incidentally, since the wire connected between the node between the battery cells V2 and V3 and the common terminal 20 is interposed with no resistor, the discharge currents are not varied by a resistor effect when the external equalizing circuit 30 operates. The explanation of the equalizing discharge operation described above is for the battery cells V2 and V3. However, the other battery cells can be equalized by the same operation as above.

Next, the operation to detect a breakage in the wires connected between the battery pack 10 and the battery voltage monitoring apparatus 10 performed by the battery voltage monitoring apparatus 10 is explained with reference to FIGS. 4 and 5. Here, as explained in the foregoing with reference to FIG. 10, the wires connected between the battery cells 11 and the RC filter circuit 40 are indicated by the characters L0, L1, L2, L3, L4 and L5, respectively, in the order from the lowest voltage side the highest voltage side.

Figure 4:
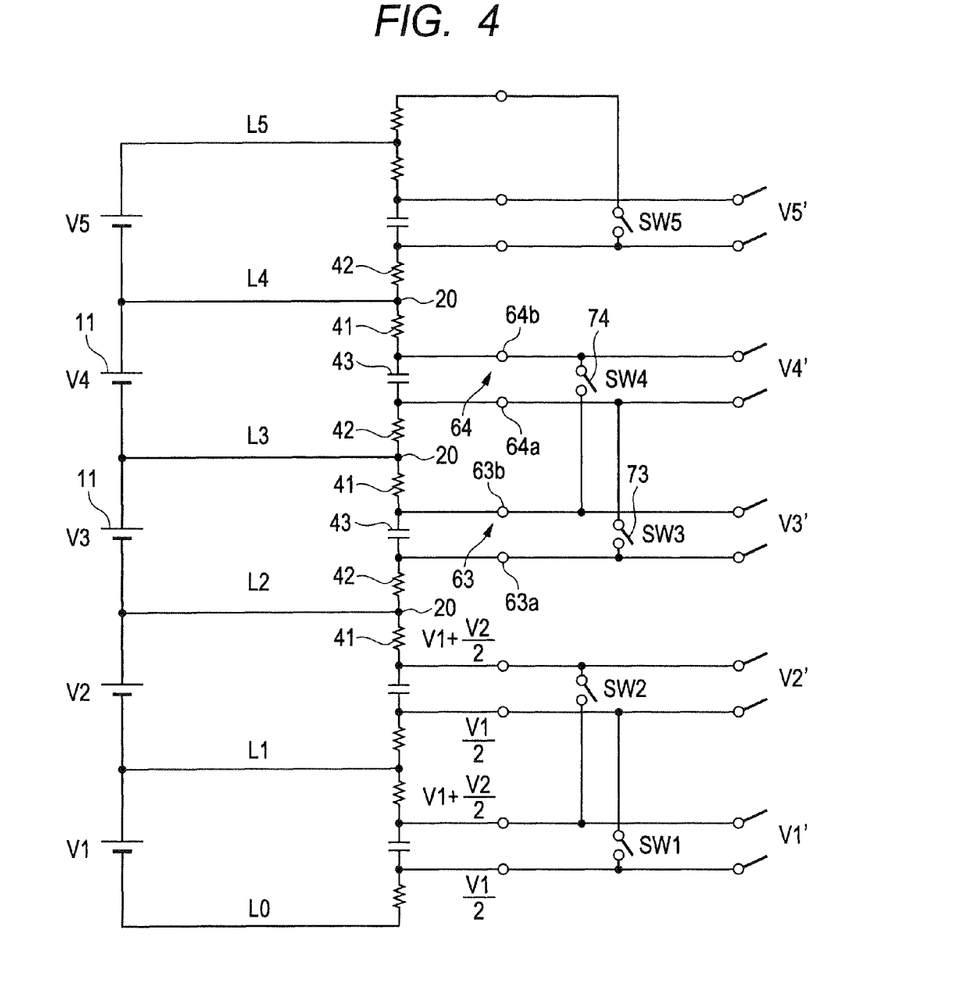
FIG. 4 is a circuit diagram for explaining the operation of the internal equalizing circuit.

FIG. 4, which shows the RC filter circuit 40 and the internal equalizing circuit 70, is for explaining the principle of the wire breakage detection operation. In FIG. 4, the internal structure of the monitoring IC 50 is omitted from illustration. In FIG. 4, it is assumed that the external equalizing circuit 30 is out of operation.

As shown in FIG. 4, the first short-circuit switches 73 respectively corresponding to the battery cells V1, V3 and V5 are indicated by "SW1", "SW3" and "SW5" respectively, and the voltages across the paired terminal 61 and 62 when the switches SW1 SW3 and SW5 are turned on respectively are indicated by "V1'", "V3'" and "V5'", respectively. Likewise, the second short-circuit switches 74 respectively corresponding to the battery cells V2 and V4 are indicated by "SW2" and "SW4", respectively, and the voltages across the paired terminal 61 and 62 when the switches SW2 and SW4 are turned on respectively are indicated by "V2'" and "V4'", respectively.

Here, the cell voltages of the battery cells V1 to V5 are indicated by V1 to V5, respectively, and the resistances of the resistor 41 and the resistor 42 are the same as each other.

This wire breakage detection operation is performed in accordance with a program stored in the microcomputer 55. The microcomputer 55 detects a wire breakage as an abnormality present between the battery pack 10 and the RC filter circuit 40 based on the voltage applied across the paired detection terminals 61 and 61 when a corresponding one of the first short-circuit switches 73 or second short-circuit switches 74 is turned on. Accordingly, the microcomputer 55 stores a wire breakage determination threshold which is lower than the cell voltage of the battery cell short-circuited by the first short-circuit switch 73 or second short-circuit switch 74 divided by the resistors 41 and 42, and is higher than 0 V. The microcomputer 55 determines that no wire breakage is present when the detected voltage is higher than the wire breakage determination threshold, and determines that a wire breakage is present when the detected voltage is lower than or equal to the wire breakage determination threshold.

Figure 5:
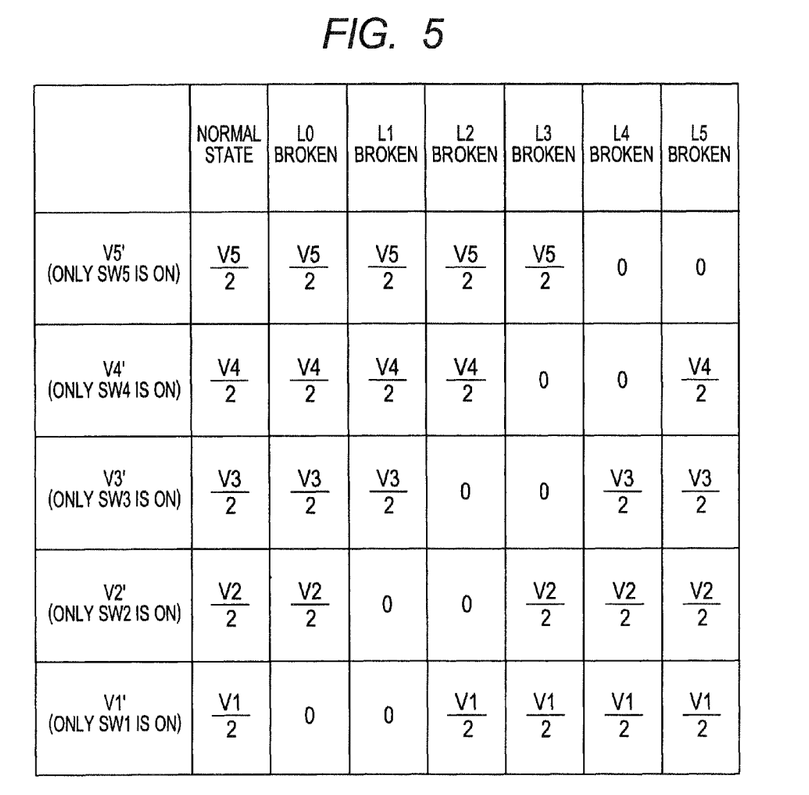
FIG. 5 is a table showing cell voltages when there is no wire breakage and when there is a wire breakage.

FIG. 5 is a table showing cell voltages when there is no wire breakage and when there is a wire breakage in one of the wires L0 to L5. As shown in this table, in the normal state where there is no wire breakage between the battery cells 11 and the RC filter circuit 40, the voltages V1' to V5' are detected to be ½ of the cell voltages V1 to V5, respectively, when the external equalizing circuit 30 is not provided. Incidentally, when the external equalizing circuit 30 is provided, the voltages V1' to V5' are not equal to ½ of the cell voltages V1 to V5, respectively.

In the following, the wire breakage detection is explained in detail taking the battery cell V1 as an example. When only the first short-circuit switch 73 corresponding to the battery cell V1 is turned on, a discharge current from the battery cell V1 flows through the current path including the common terminal 20, the resistor 42 corresponding to the battery cell V2, the lower-voltage side terminal 64a corresponding to the battery cell V2, the first short-circuit switch 73, the lower-voltage side terminal 63a corresponding to the battery cell V1 and the resistor 42 corresponding to the battery cell V1.

Accordingly, in this case, since no current flows to the higher-voltage side terminal 63b corresponding to the battery cell V1, the voltage of this higher-voltage side terminal 63b is V1. On the other hand, the lower-side terminal 63a is applied with the cell voltage of the battery cell V1 divided by the resistor 42 corresponding to the battery cell V2 and the resistor 42 corresponding to the battery cell V1. That is, the lower-side terminal 63a is applied with a voltage equal to ½ of V1. Accordingly, in the normal state, the voltage V1' is detected to be ½ of V1. Incidentally, the values of the voltages shown in FIG. 5 are absolute.

When only the second short-circuit switch SW2 is turned on, since no current flows to the lower-voltage side terminal 64a corresponding to the battery cell V2, the voltage of this lower-voltage side terminal 64a is 0 V. On the other hand, the higher-side terminal 64b is applied with the cell voltage of the battery cell V2 divided by the resistor 41 corresponding to the battery cell V2 and the resistor 41 corresponding to the battery cell V1. That is, the higher-side terminal 64b is applied with a voltage equal to ½ of V2. Accordingly, in the normal state, the voltage V2' is detected to be ½ of V2. In the normal state, the voltages of V3' to V5' are detected to ½ of V3 to V5, respectively, like the voltages of V1' and V2'.

If the wire L0 corresponding to the battery cell V1 is broken, since no discharge current flows through the above described current path when only the short-circuit switch SW1 is turned on, the voltages of the lower-side and higher-side terminals 63a and 63b corresponding to the battery cell V1 are both 1 V. Accordingly, in the case where the wire L0 is broken, the voltage of V1' is detected to be 0 V when only the short-circuit switch SW1 is turned on. Likewise, in a case where the wire L1 is broken, the voltage of V1' is detected to be 0 V when only the short-circuit switch SW1 is turned on.

Likewise, in a case where the wire L1 or L2 corresponding to the battery cell V2 is broken, the voltage of V2' is detected to be 0 V when only the short-circuit switch SW2 is turned on. Also when any one of the wires corresponding to the battery cells V3 to V5 is broken, 0 V is detected like the above cases. Hence, to determine presence of a wire breakage in the wire corresponding to the battery cell Vn (n=1 to 5), the short-circuit switch SWn is turned on.

The microcomputer 55 can reliably determine presence of a wire breakage by comparing the detected voltage with the stored wire breakage determination threshold set to a value between 0 V and the voltage to be detected in the normal state. Generally, the output voltage of a lithium ion battery is about 3 V. Accordingly, since a half of the cell voltage is much higher than 0 V, it is possible to determine presence of a wire breakage by comparison between 0 V and the detected voltage which is much higher than 0 V. Especially, even when the wire L0 on the lowest voltage side or the wire L5 on the highest voltage side is broken, a wire breakage is reliably detected because the difference between the detected voltage (0 V) and a half of the cell voltage (about 1.5 V) is sufficiently large.

As explained above, the embodiment of the invention includes, as a noise countermeasure, the RC filter circuit 40 having the structure in which, for each of the battery cells 11, the common terminal 20 is branched into two branches connected with the resistor 41 and the resistor 42, respectively.

Accordingly, since no resistor is present as an RC filter component between the battery pack 10 and the RC filter circuit 40, it is possible to increase, for each current pathway across n series-connected battery cells 11, the number of the resistors 41 and 42 with the increase of the number of the battery cells 11. Hence, for each of the current pathways, the number of the capacitors and the number of the resistors 41 and 42 are cancelled out with each other, variation in cut-off frequency among the respective current pathways can be reduced.

As explained above, in this embodiment, the internal equalizing circuit 70 is formed by connecting the lower-voltage side terminals 63a and 64a of the first and second detection terminals 63 and 64 to the first short-circuit switch 73, and connecting the higher-voltage side terminals 63b and 64b of the first and second detection terminals 63 and 64 to the second short-circuit switch 74, so that a wire breakage can be detected based on the cell voltage divided by the resistors 41 and 42 of the RC filter circuit 40.

This is possible because the voltage of one of the paired detection terminals 61 and 62 becomes the cell voltage divided by the resistors 41 (or resistor 42) branched out from the common terminal 20, and the voltage of the other of the paired detection terminals 61 and 62 becomes 0 V in the normal state, while on the other hand, the voltages of the paired terminals 61 and 62 become the same. Since the difference between the voltage detected in the normal state and the voltage detected when there is a wire breakage is sufficiently large, it is possible to reliably determine presence of a wire breakage. This makes it possible to prevent erroneous determination of presence or absence of a wire breakage.

Other Embodiments

It is a matter of course that various modifications can be made to the above described embodiment. For example, the monitoring IC 50 may be replaced by an appropriate discrete circuit. As the transistor 35 of the external equalizing circuit 30, an NPN transistor may be used instead of a PNP transistor.

Since the monitoring IC 50 constitutes a high voltage system, and the microcomputer 55 constitutes a low voltage system, it is preferable to provide an insulating element so that data exchange between the monitoring IC 50 and the microcomputer 55 is performed through this insulating element.

In the above embodiment, the resistors 41 and the resistor 42 have the same resistance. However, they may have different resistances.

In the above embodiment, the external equalizing circuit 30 is provided in the battery monitoring apparatus. However, the external equalizing circuit 30 may not be provided in the battery monitoring apparatus if it is unnecessary to perform the equalizing discharge using the external equalizing circuit 30.

The above explained preferred embodiments are exemplary of the invention of the present application which is described solely by the claims appended below. It should be understood that modifications of the preferred embodiments may be made as would occur to one of skill in the art.

What is claimed is:

1. A battery voltage monitoring apparatus comprising:
pairs of positive side and negative side detection terminals provided respectively corresponding to positive and negative electrodes of battery cells connected in series to form a battery pack;
an RC filter circuit interposed between the positive and negative electrodes of the battery cells and the pairs of the positive side and negative side detection terminals; and
a detection means for detecting a cell voltage of each of the battery cells applied across a corresponding one of the pairs of the positive side and negative side detection terminals,
for each adjacent two of the battery cells, the positive electrode of the battery cell on the higher voltage side and the negative electrode of the battery cell on the lower voltage side being commonly connected to a common terminal provided in the RC filter circuit,
the common terminal being branched into a first branch connected to one end of a first resistor as a component of the RC filter circuit and a second branch connected to one end of a second resistor as a component of the RC filter circuit, the first resistor being connected to a corresponding one of the positive side detection terminals at the other end thereof, the second resistor being connected to a corresponding one of the negative side detection terminals at the other end thereof
a capacitor being connected across a corresponding one of the pairs of the positive side and negative side detection terminals as a component of the RC filter circuit, wherein
when one of two pairs of the positive side and negative side detection terminals of each adjacent two of the battery cells forms a first pair and the other of the two pairs forms a second pair,
the battery voltage monitoring apparatus further comprises:
a switch device for making a short circuit between the positive side detection terminals of the first and second pairs and between the negative side detection terminals of the first and second pairs; and
a determination means for determining whether or not a circuit abnormality is present between the battery pack and the switch device based on a voltage applied across the positive side and negative side detection terminals of at least one of the first and second pairs when the switch device is turned on, the determination means being configured to determine whether or not a wire breakage is present between the battery pack and the switch device based on comparison between the applied voltage and a wire breakage determination threshold set to a value higher than 0 V and lower than the cell voltage divided by the first and second resistors.

2. A battery voltage monitoring apparatus comprising:
a pair of a positive side detection terminal and a negative side detection terminal provided corresponding to a positive side electrode and a negative side electrode of each of battery cells of a battery pack, the battery cells being connected in series; and
an RC filter circuit provided for each of the battery cells, the RC filter circuit being interposed between the positive side and negative side electrodes and the pair of the positive side and negative side detection terminals;
the battery voltage monitoring apparatus being configured to detect, for each of the battery cells, a cell voltage applied between the pair of the positive side and negative side detection terminal; wherein:
for each adjacent two of the battery cells, the positive side electrode of the battery cell on a higher voltage side and the negative side electrode of the battery cell on a lower voltage side are commonly connected to a common terminal provided in the RC filter circuit,
the common terminal is branched into a first branch connected with a first resistor as component of the RC filter circuit and a second branch connected with a second resistor as a component of the RC filter circuit, the first resistor being connected to a corresponding one of the positive side detection terminals, the second resistor being connected to a corresponding one of the negative side detection terminals,
a capacitor as a component of the RC filter circuit is connected across a corresponding one of the pairs of the positive side and negative side detection terminals,
for each adjacent two of the battery cells, a switch is provided for making a short circuit between the positive side detection terminals and between the negative side detection terminals,
a determination means for determining, for each of the switches, whether or not an abnormality is present in a circuit between the battery pack and the switch based on a voltage applied across the positive side and negative side detection terminals when the switch is turned on,
the determination means is configured to determine, for each of the switches, whether or not there is a wire breakage between the battery pack and the switch based on comparison between the applied voltage and a wire breakage determination threshold set to a value higher than 0 V and lower than the cell voltage divided by the first and second resistors, and
for each adjacent two of the battery cells, the switch includes a first short-circuit switch for short-circuiting the battery cell on the lower voltage side by way of the negative side detection terminals and a second short-circuit switch for short-circuiting the battery cell on the higher voltage side by way of the positive side detection terminals.

3. The battery voltage monitoring apparatus according to claim 1, further comprising: a multiplexer including, for each of the battery cells, a positive-electrode side switch connected to the positive side detection terminal and a negative-electrode side switch connected to the negative side detection terminal.

4. The battery voltage monitoring apparatus according to claim 1, further comprising a differential amplifier circuit connected with other ends of the positive-electrode side switch and the negative-electrode side switch which are not those ends connected to the positive side detection terminal and the negative side detection terminal.

\* \* \* \* \*